United States Patent
Calado et al.

(10) Patent No.: US 11,187,995 B2
(45) Date of Patent: Nov. 30, 2021

(54) METROLOGY USING A PLURALITY OF METROLOGY TARGET MEASUREMENT RECIPES

(71) Applicant: ASML NETHERLANDS B.V., Veldhoven (NL)

(72) Inventors: Victor Emanuel Calado, Rotterdam (NL); Youping Zhang, Cupertino, CA (US); Maurits Van Der Schaar, Eindhoven (NL); Richard Johannes Franciscus Van Haren, Waalre (NL); Xing Lan Liu, Graz (AT)

(73) Assignee: ASML Netherlands B.V., Veldhoven (NL)

( * ) Notice: Subject to any disclaimer, the term of this patent is extended or adjusted under 35 U.S.C. 154(b) by 308 days.

(21) Appl. No.: 16/346,135

(22) PCT Filed: Nov. 1, 2017

(86) PCT No.: PCT/EP2017/077958
§ 371 (c)(1),
(2) Date: Apr. 30, 2019

(87) PCT Pub. No.: WO2018/095705
PCT Pub. Date: May 31, 2018

(65) Prior Publication Data
US 2021/0208512 A1 Jul. 8, 2021

Related U.S. Application Data

(60) Provisional application No. 62/426,061, filed on Nov. 23, 2016.

(51) Int. Cl.
*G03F 7/20* (2006.01)

(52) U.S. Cl.
CPC ...... *G03F 7/70625* (2013.01); *G03F 7/70633* (2013.01)

(58) Field of Classification Search
CPC .................... G03F 7/70625; G03F 7/70633
See application file for complete search history.

(56) References Cited

U.S. PATENT DOCUMENTS

| 5,969,441 A | 10/1999 | Loopstra et al. |
| 2016/0161863 A1 | 6/2016 | Den Boef et al. |
| 2017/0052454 A1* | 2/2017 | Jak ...................... G03F 7/70633 |

FOREIGN PATENT DOCUMENTS

| WO | 2011012624 | 2/2011 |
| WO | 2016162228 | 10/2016 |

OTHER PUBLICATIONS

International Search Report and Written Opinion issued in corresponding PCT Patent Application No. PCT/EP2017/077958, dated Mar. 6, 2018.

* cited by examiner

*Primary Examiner* — Steven Whitesell Gordon
(74) *Attorney, Agent, or Firm* — Pillsbury Winthrop Shaw Pittman LLP

(57) ABSTRACT

A method of measuring a parameter of a patterning process, the method including obtaining a measurement of a substrate processed by a patterning process, with a first metrology target measurement recipe; obtaining a measurement of the substrate with a second, different metrology target measurement recipe, wherein measurements using the first and second metrology target measurement recipes have their own distinct sensitivity to a metrology target structural asymmetry of the patterning process; and determining a value of the parameter by a weighted combination of the measurements of the substrate using the first and second metrology target measurement recipes, wherein the weight- (Continued)

ing reduces or eliminates the effect of the metrology target structural geometric asymmetry on the parameter of the patterning process determined from the measurements using the first and second metrology target measurement recipes.

20 Claims, 8 Drawing Sheets

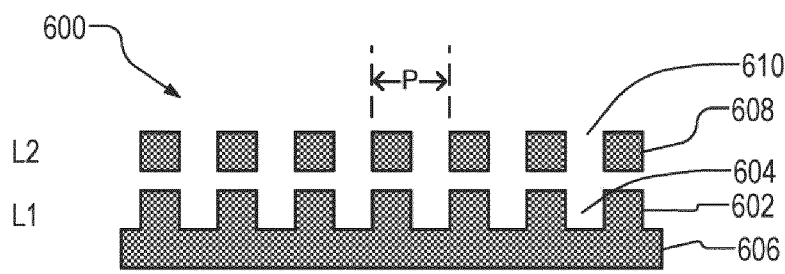
Fig. 7A
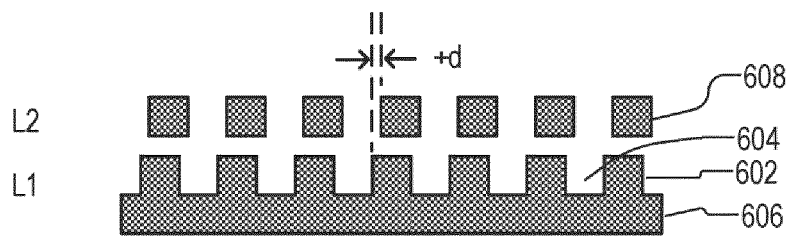
Fig. 7B
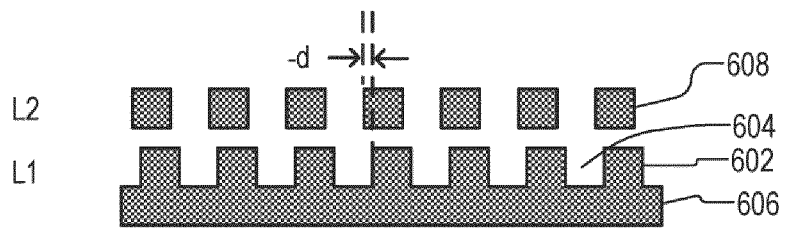
Fig. 7C
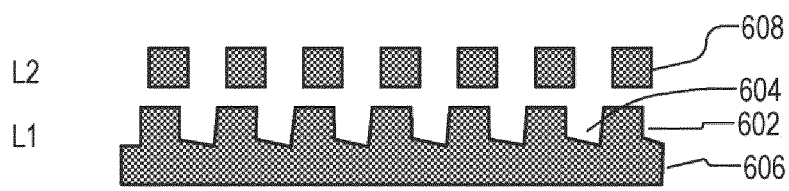
Fig. 7D
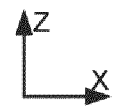

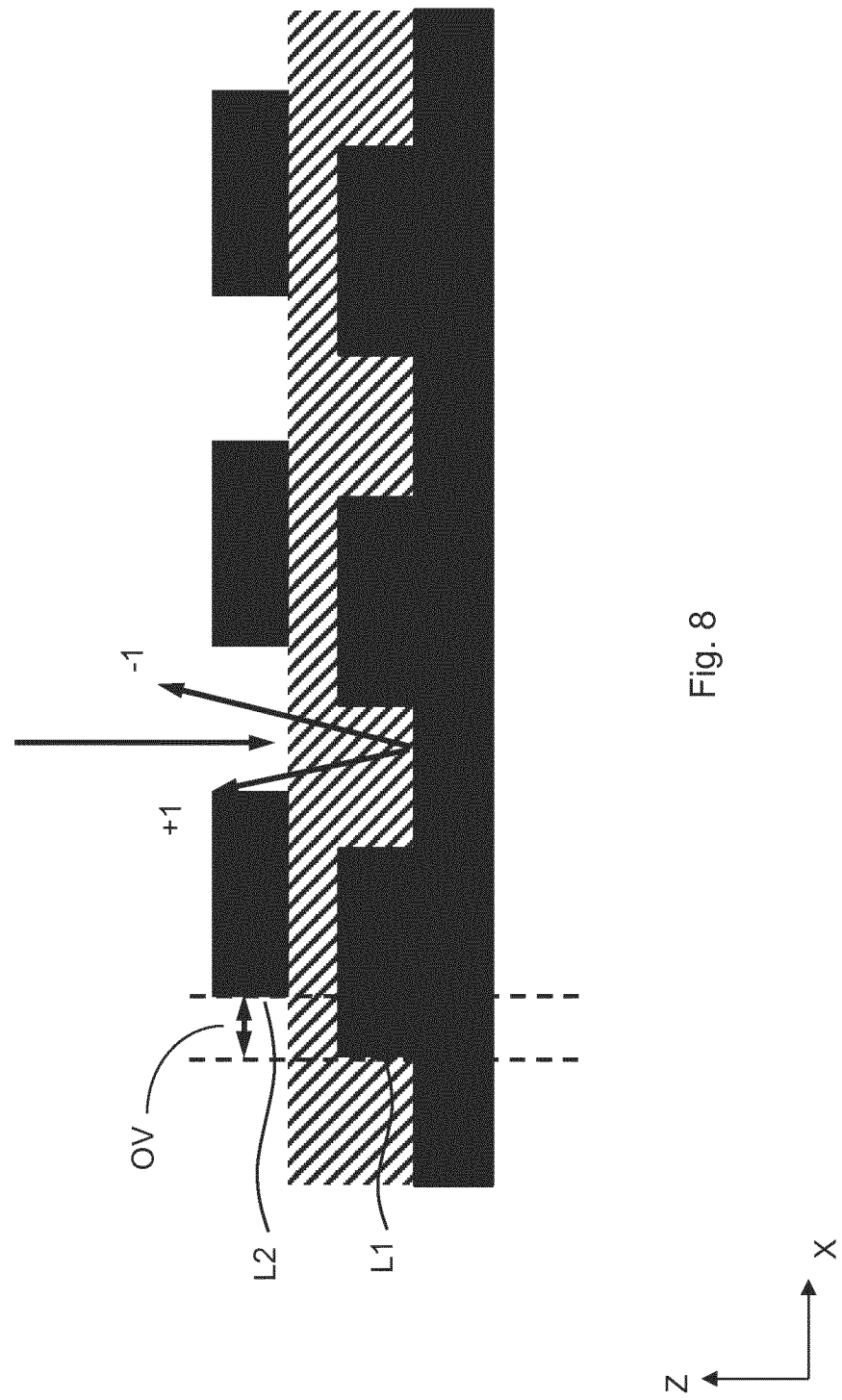

METROLOGY USING A PLURALITY OF METROLOGY TARGET MEASUREMENT RECIPES

CROSS-REFERENCE TO RELATED APPLICATIONS

This application is the U.S. national phase entry of PCT patent application no. PCT/EP2017/077958, which was filed on Nov. 1, 2017, which claims the benefit of priority of U.S. provisional application No. 62/426,061, which was filed on Nov. 23, 2016 and which is incorporated herein in its entirety by reference.

FIELD

The description herein relates to methods and apparatuses for metrology of the manufacture of devices by lithography techniques.

BACKGROUND

A lithography apparatus can be used, for example, in the manufacture of integrated circuits ICs. In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time.

In one type of lithography apparatus, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction.

Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device. Prior to transferring the pattern from the patterning device to the substrate, the substrate may undergo various procedures, such as priming, resist coating and a soft bake. After exposure, the substrate may be subjected to other procedures, such as a post-exposure bake PEB, development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing CMP, and ion implantation. Multiple devices may be fabricated on a plurality of dies on a substrate and then separated into individual devices. This device manufacturing process may be considered a patterning process. A patterning process involves a patterning step, such as optical and/or nano-imprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

Among the multiple layers of the devices, the accuracy of alignment (i.e. overlay) of any two overlapping pattern layers in a device may be measured by, for example, an inspection apparatus that directs radiation at a metrology target that re-directs the beam and measuring the intensities of the redirected beam. For example, by using dark field scatterometry, radiation intensity of the zero-th order of diffraction can be blocked, and radiation intensities of higher orders (for example, $-1^{st}$ and $+1^{st}$ orders) of diffraction are measured to obtain a diffraction response A that is a difference between the radiation intensities of the $-1^{st}$ order and the $+1^{st}$ order of diffraction.

SUMMARY

In an embodiment, there is provided a method of measuring a parameter of a patterning process, the method comprising: obtaining a measurement of a substrate processed by a patterning process, with a first metrology target measurement recipe; obtaining a measurement of the substrate with a second, different metrology target measurement recipe, wherein measurements using the first and second metrology target measurement recipes have their own distinct sensitivity to a metrology target structural asymmetry of the patterning process; and determining, by a hardware computer, a value of the parameter by a weighted combination of the measurements of the substrate using the first and second metrology target measurement recipes, wherein the weighting reduces or eliminates the effect of the metrology target structural geometric asymmetry on the parameter of the patterning process determined from the measurements using the first and second metrology target measurement recipes.

In an embodiment, there is provided a method comprising: designing, by a hardware computer, a first metrology target measurement recipe for measuring a substrate processed by a patterning process and for determining a parameter of the patterning process; designing, by the hardware computer, a second metrology target measurement recipe for measuring the substrate processed by the patterning process and for determining the parameter of the patterning process, wherein the first and second metrology target measurement recipes are designed with their own distinct sensitivity to a metrology target structural asymmetry; and determining, by the hardware computer, a weighting for the combination of measurement results using the first and second metrology target measurement recipes, to reduce or eliminate the effect of the metrology target structural asymmetry on the parameter of the patterning process determined from the measurement results using the first and second metrology target measurement recipes.

In an embodiment, there is provided a computer program product comprising a computer non-transitory readable medium having instructions recorded thereon, the instructions when executed by a computer implementing a method as described herein.

BRIEF DESCRIPTION OF THE DRAWINGS

FIG. 7A, FIG. 7B, FIG. 7C and FIG. 7D illustrate periodic structures of an overlay metrology target with bias and a structural asymmetry;

FIG. 8 illustrates a situation of measurement of overlay with a symmetric structure;

DETAILED DESCRIPTION OF THE DRAWINGS

Figure 1:
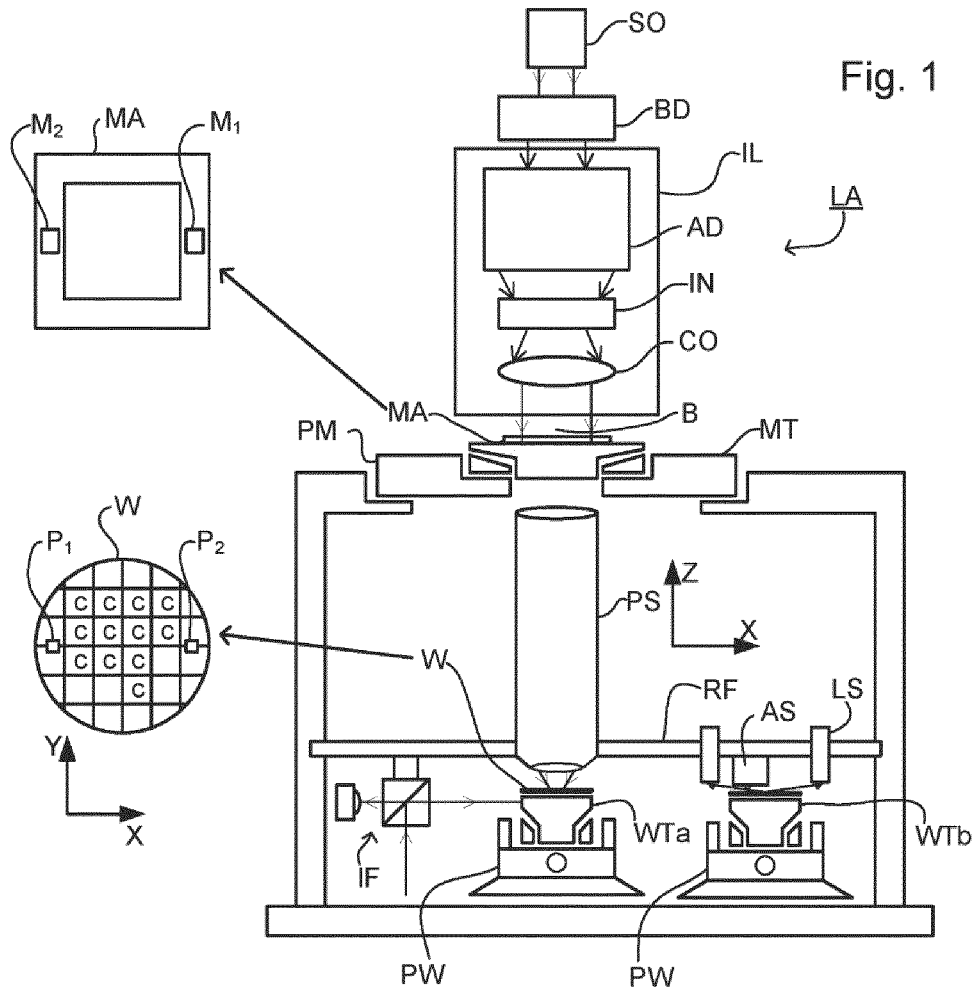
FIG. 1 illustrates a schematic diagram of a lithography apparatus.

FIG. 1 schematically depicts a lithographic apparatus LA in association with which the techniques described herein can be utilized. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a a refractive, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive patterning device). However, the apparatus may be of a reflective type (e.g., employing a programmable mirror array of a type as referred to above, or employing a reflective mask). The apparatus may employ a different kind of patterning device to classic mask; examples include a programmable mirror array or LCD matrix.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as o-outer and o-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations-an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
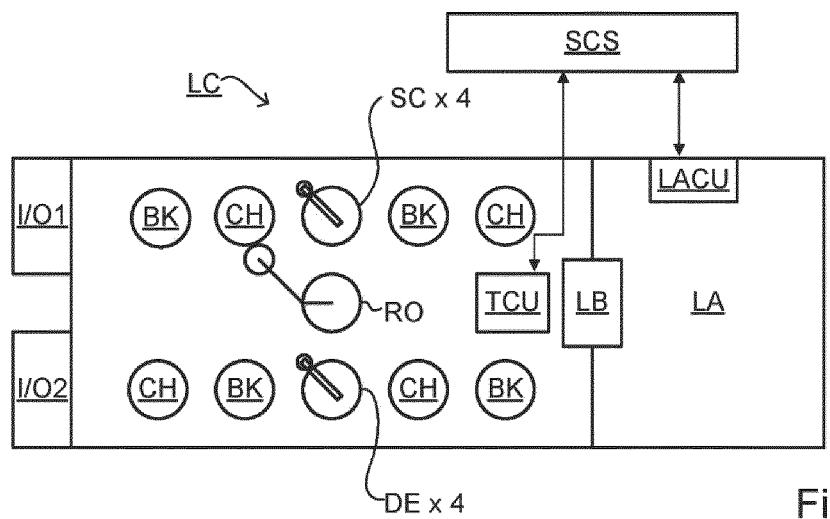
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
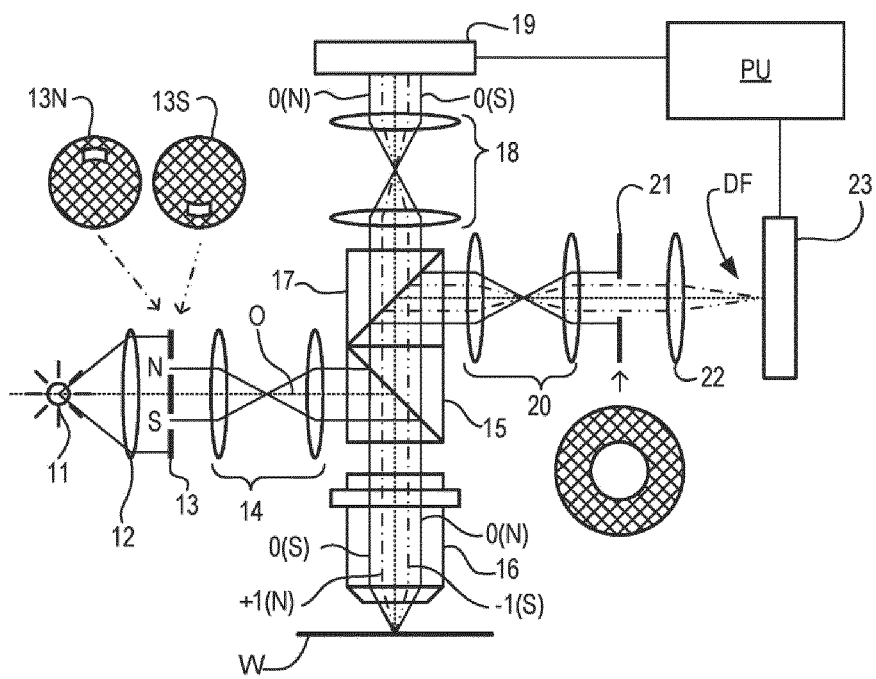
FIG. 3A depicts a schematic diagram of an inspection apparatus (e.g., a dark field scatterometer in this case) configured to measure a target using a first pair of illumination apertures.

An inspection apparatus suitable for use in embodiments is shown in FIG. 3A. A target T and diffracted rays of measurement radiation used to illuminate the target are illustrated in more detail in FIG. 3B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 3B, 3C, 3D:
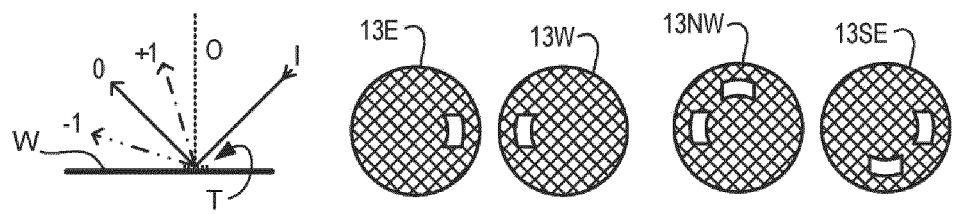
FIG. 3B schematically depicts a detail of a diffraction spectrum of a target periodic structure for a given direction of illumination.
FIG. 3C schematically depicts a second pair of illumination apertures providing further illumination modes in using the inspection apparatus of FIG. 3A for diffraction based overlay measurements.
FIG. 3D schematically depicts a third pair of illumination apertures combining the first and second pair of apertures.

As shown in FIG. 3B, target T is placed with substrate W normal to the optical axis O of objective lens 16. The substrate W may be supported by a support (not shown). A ray of measurement radiation I impinging on target T from an angle off the axis O gives rise to a zeroth order ray (solid line O) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and +1$^{st}$ orders diffracted by the target T on substrate W are collected by objective lens 16 and directed back through optical element 15. Returning to FIG. 3A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the −1$^{st}$ and +1$^{st}$ orders is present.

The particular forms of aperture plate 13 and field stop 21 shown in FIGS. 3A, 3C and 3D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3A, 3B, 3C or 3D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 3C and 3D.

Figure 4:
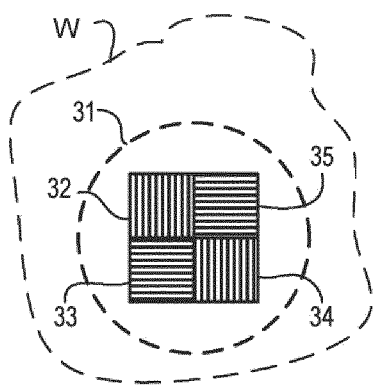
FIG. 4 depicts a form of multiple periodic structure target and an outline of a measurement spot on a substrate.

FIG. 4 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semi-conductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 7. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

Figure 5:
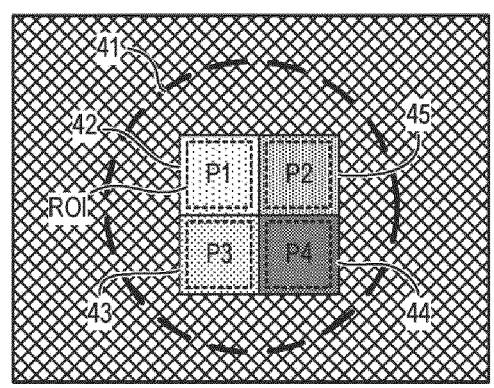
FIG. 5 depicts an image of the target of FIG. 4 obtained in the inspection apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 6:
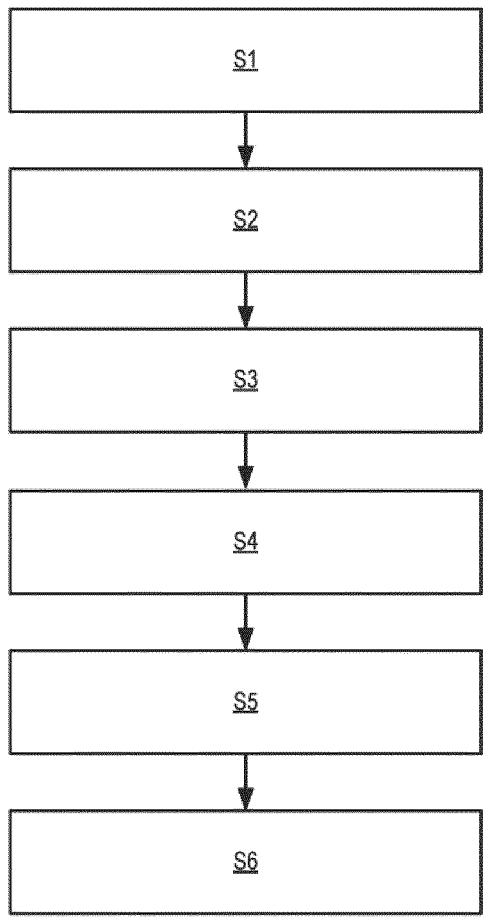
FIG. 6 is a flowchart showing steps of an overlay measurement method using the inspection apparatus of FIG. 3.

FIG. 6 illustrates how, using for example the method described in PCT patent application publication no. WO 2011/012624, which is incorporated herein in its entirety by reference, overlay error (i.e., undesired and unintentional overlay misalignment) between the two layers containing the component periodic structures 32 to 35 is measured. This measurement is done through identifying target asymmetry, as revealed by comparing the intensities in the +1$^{st}$ order and −1$^{st}$ order dark field images of the target periodic structures (the intensities of other corresponding higher orders can be compared, e.g. +2$^{nd}$ and −2$^{nd}$ orders) to obtain a measure of the intensity asymmetry. At step S1, the substrate, for example a semiconductor wafer, is processed through a lithographic apparatus, such as the lithographic cell of FIG. 2, one or more times, to create a target including the periodic structures 32-35. At S2, using the inspection apparatus of FIG. 3, an image of the periodic structures 32 to 35 is obtained using only one of the first order diffracted beams (say −1$^{st}$ order). At step S3, whether by changing the illumination mode, or changing the imaging mode, or by rotating substrate W by 180° in the field of view of the inspection apparatus, a second image of the periodic structures using the other first order diffracted beam (+1$^{st}$ order) can be obtained. Consequently the +1$^{st}$ order diffracted radiation is captured in the second image.

Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level. In step S4, a region of interest (ROI) is identified within the image of each component target periodic structure, from which intensity levels will be measured.

Having identified the ROI for each individual target periodic structure and measured its intensity, the asymmetry of the target, and hence overlay error, can then be determined. This is done (e.g., by the processor PU) in step S5 comparing the intensity values obtained for +1$^{st}$ and −1$^{st}$ orders for each target periodic structure 32-35 to identify their intensity asymmetry, e.g., any difference in their intensity. The term "difference" is not intended to refer only to subtraction. Differences may be calculated in ratio form. In step S6 the measured intensity asymmetries for a number of target periodic structures are used, together with knowledge of any known imposed overlay biases of those target periodic structures, to calculate one or more performance parameters of the patterning process in the vicinity of the target T.

A performance parameter of great interest is overlay, but other parameters of performance of the patterning process can be calculated. The performance parameter (e.g., overlay, CD, focus, dose, etc.) can be fed back (or fed forward) for improvement of the patterning process, improvement of the target, and/or used to improve the measurement and calculation process of FIG. 6 itself.

Now, FIG. 7 shows schematic cross sections of target periodic structures (overlay periodic structures), with different bias offsets. These can be used as the target T on substrate W, as seen in FIGS. 3 and 4. Periodic structures with periodicity in the X direction are shown for the sake of example only. Different combinations of these periodic structures with different biases and with different orientations can be provided separately or as part of a target.

Starting with FIG. 7A, a target 600 formed in at least two layers, labeled L1 and L2, is shown. In the lower or bottom layer L1, a first periodic structure (the lower or bottom periodic structure), for example a grating, is formed by features 602 and spaces 604 on a substrate 606. In layer L2, a second periodic structure, for example a grating, is formed by features 608 and spaces 610. (The cross-section is drawn such that the features 602, 608 (e.g., lines) extend into the page.) The periodic structure pattern repeats with a pitch P in both layers. Features 602 and 608 may take the form of lines, dots, blocks and via holes. In the situation shown at FIG. 7A, there is no overlay contribution due to misalignment, e.g., no overlay error and no imposed bias, so that each feature 608 of the second structure lies exactly over a feature 602 in the first structure.

At FIG. 7B, the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At FIG. 7C, another feature with a second known imposed bias −d, such that the features of 608 are shifted to the left, is depicted. The value of d need not be the same for each structure. Biased periodic structures of this type shown at FIGS. 7A to 7C are described in the prior patent application publications mentioned above.

FIG. 7D shows schematically a phenomenon of structural asymmetry, in this case structural asymmetry in the first structure (bottom structure asymmetry). The features in the periodic structures at FIGS. 7A to 7C, are shown as perfectly square-sided, when a real feature would have some slope on the side, and a certain roughness. Nevertheless they are intended to be at least symmetrical in profile. The features 602 and/or spaces 604 at FIG. 7D in the first structure no longer have a symmetrical form at all, but rather have become distorted by one or more processing steps. Thus, for example, a bottom surface of each space has become tilted (bottom wall tilt). For example, side wall angles of the features and spaces have become asymmetrical. As a result of this, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 6 using only two biased periodic structures, the process-induced structural asymmetry cannot be distinguished from the overlay contribution due to misalignment, and overlay measurements (in particular to measure the undesired overlay error) become unreliable as a result. Structural asymmetry in the first structure (bottom periodic structure) of a target is a common form of structural asymmetry. It may originate, for example, in the substrate processing steps such as chemical-mechanical polishing (CMP), performed after the first structure was originally formed.

To help determine a metrology target for use, the concept of a metrology target measurement recipe can be used. The metrology target measurement recipe specifies one or more parameters of the measurement using the measurement system. In an embodiment, the term "metrology target measurement recipe" includes one or more parameters of the measurement itself, one or more parameters of a pattern measured, or both.

In this context, a pattern measured (also referred to as a "target" or "target structure") may be a pattern that is optically measured, e.g., whose diffraction is measured. The pattern measured may be a pattern specially designed or selected for measurement purposes. Multiple copies of a target may be placed on many places on a substrate. For example, a metrology target measurement recipe may be used to measure overlay. In an embodiment, a metrology target measurement recipe may be used to measure another process parameter (e.g., dose, focus, CD, etc.) In an embodiment, a metrology target measurement recipe may be used for measuring alignment of a layer of a pattern being imaged against an existing pattern on a substrate; for example, a metrology target measurement recipe may be used to align the patterning device to the substrate, by measuring a relative position of the substrate.

In an embodiment, if the metrology target measurement recipe comprises one or more parameters of the measurement itself, the one or more parameters of the measurement itself can include one or more parameters relating to a measurement beam and/or measurement apparatus used to make the measurement. For example, if the measurement used in a metrology target measurement recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In an embodiment, if the metrology target measurement recipe comprises one or more parameters of a pattern measured, the one or more parameters of the pattern measured may include one or more geometric characteristics (such as a shape of at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a segmentation of a feature of the pattern (e.g., a division of a feature of a periodic structure into sub-structures), and/or a length of a periodic structure or of a feature of the periodic structure), and/or a materials property (e.g., refractive index, extinction coefficient, material type, etc.) of at least part of the pattern, and/or an identification of the pattern (e.g., distinguishing a pattern being from another pattern), etc.

A metrology target measurement recipe may be expressed in a form like $(r_1, r_2, r_3, \ldots r_n; t_1, t_2, t_3, \ldots t_m)$, where $r_i$ are one or more parameters of the measurement and $t_j$ are one or more parameters of one or more patterns measured. As will be appreciated, n and m can be 1. Further, the metrology target measurement recipe does not need to have both one or more parameters of the measurement and one or more parameters of one or more patterns measured; it can have just one or more parameters of the measurement or have just one or more parameters of one or more patterns measured.

A target may be subjected to measurement using two metrology target measurement recipes A and B, e.g., differ on the stage at which a target is measured (e.g., recipe A measures a target when it comprises a latent image structure and recipe B measures a target when it doesn't comprise a latent image structure) and/or differ on the parameters of their measurement. Metrology target measurement recipes A and B can at least differ on the target measured (e.g., recipe A measures a first target and recipe B measures a second different target). Metrology target measurement recipes A and B may differ on the parameters of their measurement of a target. Metrology target measurement recipes A and B may not even be based on the same measurement technique. For example recipe A may be based on diffraction-based measurement and recipe B may be based on scanning electron microscope (SEM) or atomic force microscopy (AFM) measurement.

Further, to help determine a metrology target for use, a performance parameter (e.g., overlay) as determined by an inspection apparatus can be obtained using a simulation that simulates the optical process of how a metrology target is measured using a measurement beam of the inspection apparatus. Simulation techniques, such as a Maxwell solver and rigorous coupled-wave analysis (RCWA), can be used to perform the simulation of the optical measurement. To enable the simulation, patterning process context information (such as patterning process materials in which or on which a metrology target is produced, etc.) can be provided to enable the simulation. Further, in an embodiment, the simulation uses information regarding the nature of the metrology target (e.g., pitch, CD, etc.) and of the measurement itself (e.g., wavelength, polarization, etc.) to arrive at the simulation results. Further, the simulation can enable one or more metrology target measurement recipe parameters to be varied such that an optimal or certain metrology target measurement recipe can be derived. For example, if a metrology target is specified, one or more parameters of the measurement itself (e.g., wavelength, polarization, etc.) can be varied. Or, if the parameters of the measurement itself are specified, one or more parameters of the metrology target (e.g., CD, pitch, etc.) can be varied. Of course, both parameters of the metrology target and of the measurement itself can be varied together.

To determine whether an optimal measurement recipe has been derived, one or more metrology performance indicators can be evaluated such as detectability of a measurement signal, printability of the metrology target, robustness to process variation (e.g., variation in the target, variation in the measurement itself, etc.), etc. To consider, e.g., robustness, the simulation can introduce perturbations in simulation parameters (such as perturbation in side wall angle, perturbation in bottom wall tilt, perturbation in CD, etc.) to evaluate how the metrology responds to patterning process variations (such as variations in etching, variations in planarization, variations in the measurement itself, etc.). Thus, in an embodiment, the simulation process can account for structural asymmetry of a metrology target by, for example, perturbing values to effectively artificially create a structural asymmetry (which perturbation could be constrained or guided by patterning process information). Such perturbation may be useful for determining a metrology target measurement recipe robust to one or more structural asymmetries.

Accordingly, in an embodiment, to determine one or more metrology target measurement recipes for measuring a desired process parameter (e.g., overlay) in a patterning process, a plurality of metrology target measurement recipes can be evaluated against one or more metrology performance indicators to identify such one or more metrology target measurement recipes. This can be accomplished, for example, by ranking metrology target measurement recipes according to one or more performance indicators and using one or more highly ranked metrology target measurement recipes.

As noted above, structural asymmetry can be caused by processing (etching, planarization, etc.). This processing asymmetry can impact the measurement signal. That is, the measurement can be perturbed by the processing asymmetry, and result in inaccurate measurement results.

FIG. 8 illustrates an embodiment of overlay measurement using a diffraction-based overlay (DBO) method. In an ideal situation, the radiation intensities of positive and negative diffraction orders (e.g., $-1^{st}$ and $+1^{st}$ orders) are symmetrical with an ideal upper periodic structure L2 and an ideal lower periodic structure L1 and the intensity would be equal when the spaces of the ideal lower periodic structure L1 perfectly align with the spaces of an ideal upper periodic structure L2. When there is an overlay OV as shown in FIG. 5 when there is a relative displacement between the lower periodic structure L1 and the upper periodic structure L2 in, e.g., the X direction as shown in FIG. 5, there will be an asymmetry in the intensities of the positive and negative diffraction orders. The intensity asymmetry A (e.g., the difference between $-1^{st}$ and $+1^{st}$ diffraction orders) is proportional to the overlay OV, that is $$A = K \cdot OV \qquad (Eq. 1)$$

where K is the overlay sensitivity of the intensity asymmetry A to overlay OV. The sensitivity K is a function of wavelength $\lambda$ of the incident measurement radiation beam, polarization p of the incident measurement radiation beam, and geometry of the periodic structures L1 and L2 (e.g., in terms of CD, pitch, bias, segmentation, etc.).

Figure 9:
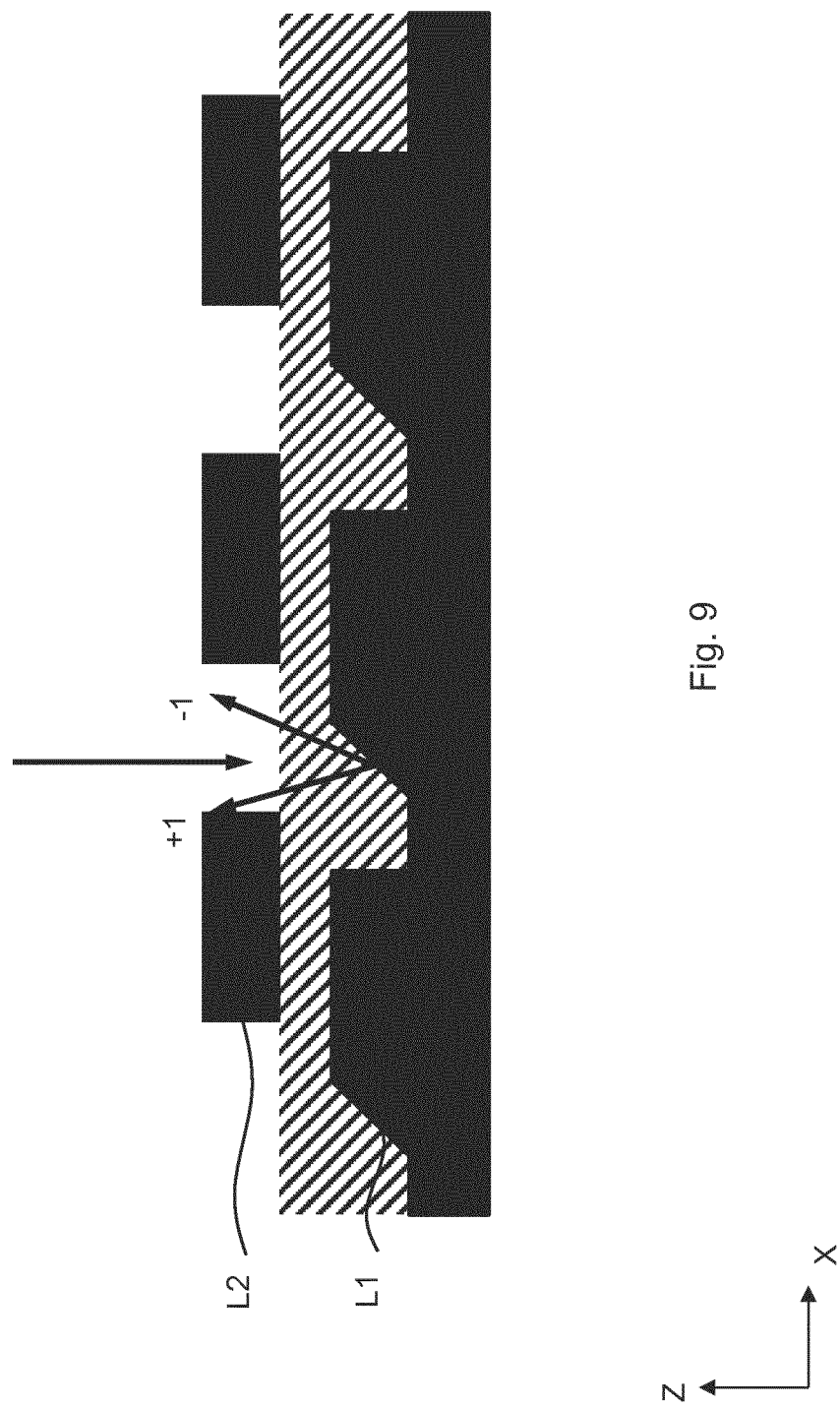
FIG. 9 illustrates a situation of measurement of overlay with a structural asymmetry.

FIG. 9 shows a situation of a structural asymmetry, which in this case is a side wall angle asymmetry of the features of the lower periodic structure L1. In this case, the side wall angle is different on the left side of the features compared to the right side of the features. The structural asymmetry can arise due to processing such as chemical-mechanical processing CMP. Therefore, in addition to an asymmetry in the intensity due to an overlay displacement between the lower periodic structure L1 and the upper periodic structure L2 in, e.g., the X direction as shown in FIG. 6, an intensity asymmetry arises due to the structural asymmetry (i.e., the structural asymmetry perturbs the radiation scattering). The intensity asymmetry A in this situation is not only proportional to the overlay OV but also dependent upon the structural asymmetry a, that is $$A = K \cdot OV + S \cdot \alpha \qquad (Eq. 2)$$

where S is the structural asymmetry sensitivity of the intensity asymmetry A to the structural asymmetry a. The sensitivities K and S are both functions of wavelength $\lambda$ of the incident measurement radiation beam, polarization p of the incident measurement radiation beam, and geometry of the periodic structures L1 and L2 (e.g., in terms of CD, pitch, bias, segmentation, etc.).

Thus, in the case of diffraction based metrology targets, the structural asymmetry contribution due to processing can result in an amplitude-offset and a phase change locally on the intensity asymmetry versus overlay curve. Various methods can be used to try to eliminate the real part of the process-asymmetry contribution and try to eliminate only one type of asymmetry. This typically involves using a single particular metrology target measurement recipe (e.g., involving a single metrology target and a single combination of measurement parameters). But, the imaginary part and/or more general multiple asymmetry origins can still affect the overlay accuracy. So, when multiple orthogonal sources of structural asymmetry are present, compromises are made to arrive at a single particular metrology target measurement recipe.

Accordingly, it would be desirable to have a method to design one or more metrology targets that can account for the imaginary part of structural asymmetry and/or for more general multiple asymmetry origins. Further, it would be desirable to a have method to determine overlay using one or more metrology targets that can account for the imaginary part of structural asymmetry and/or for more general multiple asymmetry origins.

So, in an embodiment, there is provided a method wherein two or more diffraction-based target measurements $J_i$ are made with different metrology target measurement recipes. The measurements $J_i$ can be of two or more different metrology target designs (e.g., in terms of CD, bias, segmentation, pitch, etc.) with a common recipe for the measurement itself (e.g., a common wavelength, polarization, etc.) or of a common metrology target design with different recipes for the measurement itself (e.g., a difference in polarization, wavelength, etc.). Each measurement $J_i$ is set-up so that it has its own distinct structural asymmetry sensitivity $S_{ij}$ and/or overlay sensitivity $K_{ij}$ to a certain structural asymmetry $a_j$ caused by processing in a particular patterning process. Distinct in this case doesn't necessarily mean that each sensitivity $S_{ij}$ or $K_{ij}$ is different; for example, the structural asymmetry sensitivities $S_{ij}$ can be the same if there is a difference in overlay sensitivities $K_{ij}$ or the overlay sensitivities $K_{ij}$ can be the same if there is a difference in structural asymmetry sensitivities $S_{ij}$. This determination of sensitivities can be done, e.g., by using a simulation as discussed above wherein a particular asymmetry $a_j$ (e.g., side wall angle asymmetry, bottom wall tilt asymmetry, etc.) can be simulated to identify that a particular measurement $J_i$ (i.e., a measurement result arising from a particular combination of metrology target design and recipe for the measurement itself) has a sensitivity to that particular asymmetry $a_j$. Then, by combining this all together with an appropriate relative weighting factor $w_i$, an overlay measurement can be derived wherein essentially all structural asymmetry contributing to metrology overlay error is eliminated.

Processing knowledge (such as values of one or more etching performance parameters, of one or more planarization performance parameters, etc., which values can be determined by measurement, by modeling, etc.) can be used an input to decide which type of structural asymmetries with distinct effect are the most relevant in a particular patterning process. For example, certain processing steps are more likely to cause or affect bottom wall tilt or side-wall angle asymmetry. And, thus, the one or more most likely and/or significant structural asymmetries can be identified and thus used in the design of measurements $J_i$ with distinct sensitivities $S_{ij}$ and/or $K_{ij}$ to certain structural asymmetries $a_j$.

So, with N number of relevant structural asymmetries $a_j$, N+1 intensity measurements $A_i$, each with a corresponding weighting factor $w_i$, can be used to derive an overlay OV. Taking a simple example with only one structural asymmetry, the diffraction responses $A_0$, $A_1$ (e.g., the intensity difference between $+1^{st}$ order diffraction and $-1^{st}$ order diffraction) for two adjacent metrology targets (each having a bias so to enable the respective overlay sensitivity K to be determined) with the assumption that they have the same structural asymmetry a and same overlay OV is written as:

$$A_0 = K_0 \cdot OV + S_0 \cdot a \quad \text{(Eq. 3)}$$

$$A_1 = K_1 \cdot OV + S_1 \cdot a \quad \text{(Eq. 4)}$$

where $K_0$ and $K_1$ are the respective overlay sensitivities, and $S_0$ and $S_1$ are the respective structural asymmetry sensitivities. Eq. 3 and Eq. 4 may then be combined into a combined diffraction response with weighting factor $w_1$:

$$A_{combo} = A_0 + w_1 A_1 = (K_0 + w_1 K_1) OV + (S_0 + w_1 S_1) a \quad \text{(Eq. 5)}$$

Then, the structural asymmetry a can be eliminated by a weighting factor that equals:

$$w_1 = -\frac{S_0}{S_1} \quad \text{(Eq. 6)}$$

With a weight factor $w_1$ close to or equal to the value of $$-\frac{S_0}{S_1},$$

the term $(S_0 + q_1 S_1)a$ approaches zero and so the effect of structural asymmetry a in determining overlay OV may be negligible. Thus, determination of overlay using these formulas and the appropriate weight factor $w_1$ can yield an overlay value essentially free from a contribution due to structural asymmetry a. So, if the structural asymmetry a is effectively eliminated, the overlay sensitivity (effective $\tilde{K}$) should be sufficiently high to yield a good overlay OV result. So, the following condition should be satisfied:

$$|K_0 + w_1 K_1| \gg 1 \quad \text{(Eq. 7)}$$

Accordingly, two metrology target measurement recipes can be designed that have diffraction responses $A_0$ and $A_1$ with overlay and structural asymmetry sensitivities $K_0$, $K_1$, $S_0$, and $S_1$ such that a parameter C is:

$$C = \left| \frac{K_0}{K_1} - \frac{S_0}{S_1} \right| \gg 0 \quad \text{(Eq. 8)}$$

In an embodiment, the value of C is a maximum or 99% or more of the maximum, 95% or more of the maximum, 90% or more of the maximum, or 85% or more of the maximum. In an embodiment, the value of C is a highest value available given one or more particular provided values of the metrology target measurement recipes or one or more constraints on the metrology target measurement recipes. For example, a certain metrology target pitch may be specified and/or the metrology target pitch may be constrained to be above a certain value; such a value and/or constraint may dictate a greatest C value available. In that case, the selected C value can be within the top 1%, within the top 5%, within the top 10%, or within the top 15% of the highest values of C.

So, in an embodiment, a simulation as described above can be used to calculate overlay sensitivities $K_0$, $K_1$ and use perturbation as described above (e.g., set the simulator to zero overlay and then applying a perturbation of the structural asymmetry) to calculate structural asymmetry sensitivities $S_0$, $S_1$, for a plurality of metrology target measurement recipes to find two metrology target measurement recipes that meet Eq. 8. In an embodiment, this can be done by evaluating a plurality of different target designs and for multiple measurement settings, such as wavelength λ of the measurement radiation and polarization p of the measurement radiation, to yield multiple values C(λ, p). The metrology target designs that lead to a high C(λ, p) (e.g., highest, top 10%, top 20%, etc.) for as many different λ and p can be selected as the metrology target designs (which can then be measured using the associated measurement settings). Where possible, the same metrology target design can be used for the two measurements, but different measurement settings are determined for the two measurements that meet Eq. 8 and that yield a high C (e.g., highest, top 5%, top 10%, top 20%, etc.).

So, with the two optimal metrology target measurement recipes and the associated overlay and structural asymmetry sensitivities $K_0$, $K_1$, $S_0$, $S_1$, the overlay OV can be determined from Eq. 5 using measured diffraction responses $A_0$ and $A_1$ obtained using the respective two optimal metrology target measurement recipes. For example, overlay OV can be calculated as follows $$OV = (1-\alpha) OV_0 + \alpha OV_1 \quad \text{(Eq. 9)}$$

wherein overlay $OV_0$ is measured using a first metrology target measurement recipe, overlay $OV_1$ is measured using a second metrology target measurement recipe and $$\alpha = \frac{1}{1 - \frac{K_0 S_1}{K_1 S_0}} \quad \text{(Eq. 10)}$$

Since a target intensity asymmetry has, in general, an amplitude and a phase part and can be caused by multiple asymmetry origins (CMP, etching, etc.) leading to multiple structural asymmetries, it is desirable to have more than two metrology target measurement recipes. So, extending the situation to a general case with N structural asymmetries (where N is a natural number), the calculation would extend to N+1 metrology target measurement recipes having N distinct structural asymmetries:

$$A_{combo} = A_0 + \Sigma_{i=1}^{N} w_i A_i \quad \text{(Eq. 11)}$$

$$\tilde{K} = K_0 + \Sigma_{i=1}^{N} w_i K_i \quad \text{(Eq. 12)}$$

$$\tilde{S} = \Sigma_{j=1}^{N} a_j (S_{0j} + \Sigma_{i=1}^{N} w_i S_{ij}) \quad \text{(Eq. 13)}$$

$$A_{combo} = \tilde{K} \cdot OV + \tilde{S} \quad \text{(Eq. 14)}$$

where the above terms in Eqs. 11 to 14 have the same definitions as the terms in Eqs. 3 to 8, and $\tilde{K}$ and $\tilde{S}$ are respectively the effective overlay K sensitivity and the effective structural asymmetry. The combined diffraction response A due to N structural asymmetries, i.e. $A_{combo}$, may be insensitive to processing asymmetry in the limits of $|\tilde{K}| \gg 1$ and $|\tilde{S}| \ll 1$. So, these terms can be converted to vectors and matrices as follows:

$$\vec{A} = \begin{pmatrix} A_0 \\ A_1 \\ A_2 \\ \vdots \\ A_N \end{pmatrix}, \vec{W} = \begin{pmatrix} 1 \\ w_1 \\ w_2 \\ \vdots \\ w_N \end{pmatrix}, \vec{K} = \begin{pmatrix} K_0 \\ K_1 \\ K_2 \\ \vdots \\ K_N \end{pmatrix},$$ (Eq. 15)

$$\vec{S}_0 = \begin{pmatrix} S_{01} \\ S_{02} \\ S_{03} \\ \vdots \\ S_{0N} \end{pmatrix}, S = \begin{pmatrix} S_{11} & S_{12} & \ldots & S_{1N} \\ S_{21} & S_{22} & & \\ \vdots & & \ddots & \vdots \\ S_{N1} & \ldots & \ldots & S_{NN} \end{pmatrix}$$

$$A_{combo} = \vec{A} \cdot \vec{W} \quad \text{(Eq. 16)}$$

$$\tilde{K} = \vec{K} \cdot \vec{W} \quad \text{(Eq. 17)}$$

So, the weighting factors follow from the structural asymmetry sensitivities as follow:

$$\vec{W} = -S^{-1} \cdot \vec{S}_0 \quad \text{(Eq. 18)}$$

Thus, optimized metrology target measurement recipes are those that have a parameter C as follows (in an embodiment, the value of C is a maximum or 95% or more of the maximum, 90% or more of the maximum, or 85% or more of the maximum):

$$C = |\vec{K} \cdot S^{-1} \cdot \vec{S}_0| >> 0 \quad \text{(Eq. 19)}$$

So, with the optimal metrology target measurement recipes and the associated overlay and structural asymmetry sensitivities K, S, the overlay OV can be determined using measured diffraction responses A obtained using the respective optimal metrology target measurement recipes.

Figure 10:
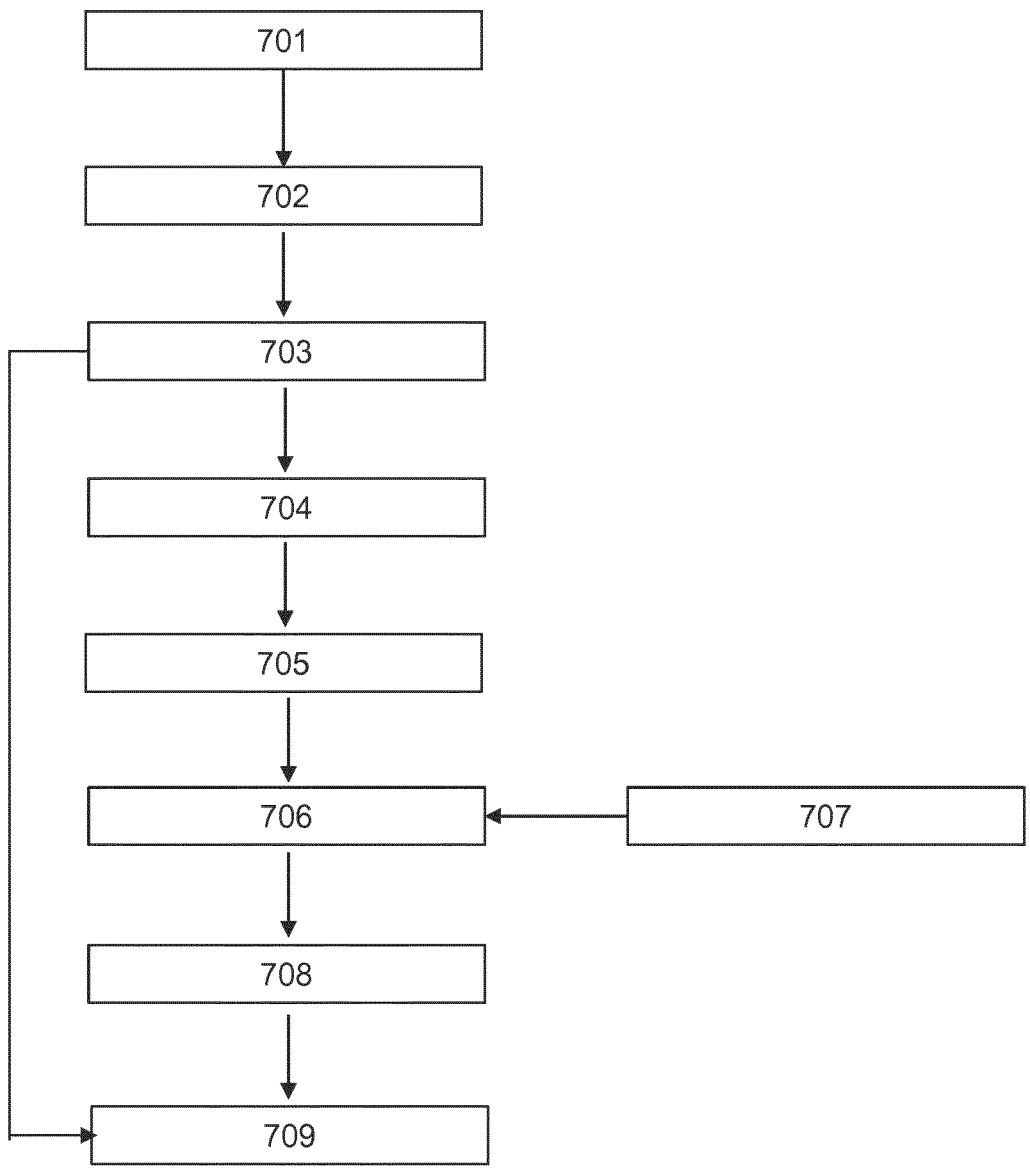
FIG. 10 illustrates a flow chart of an exemplary method of the present patent application.
Figure 11:
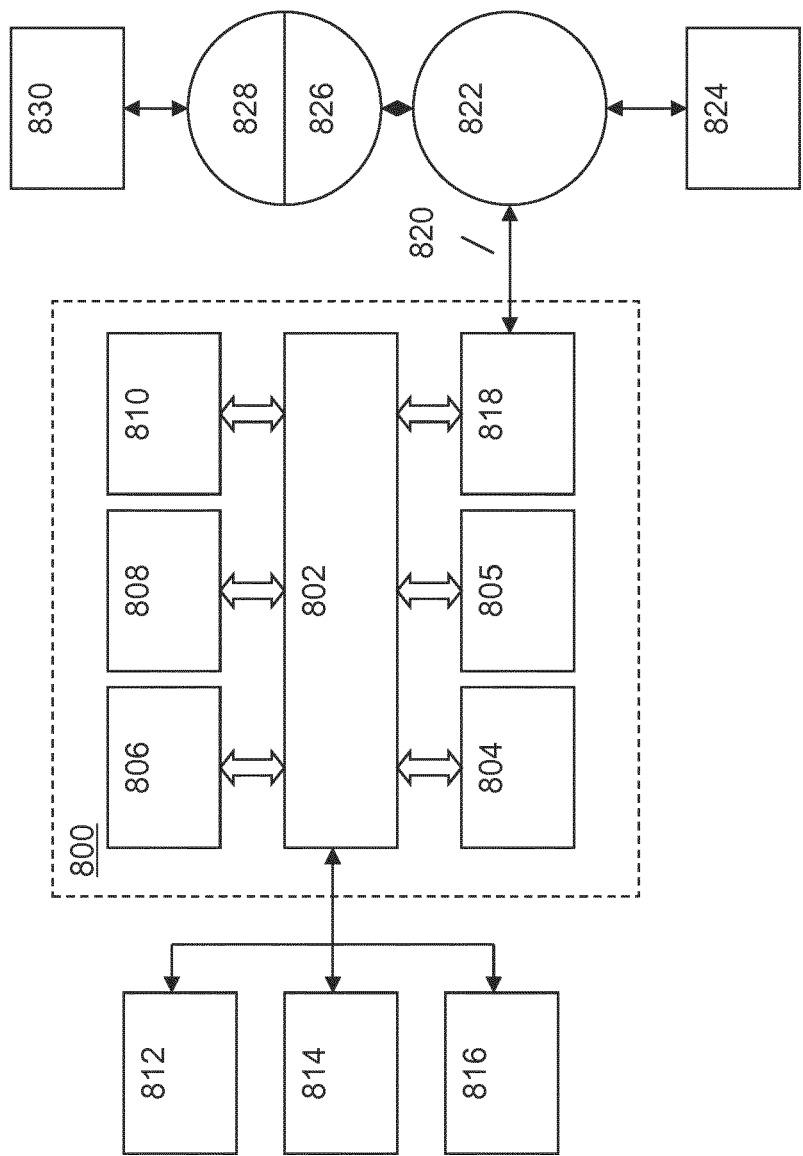
FIG. 11 shows a block diagram that illustrates an embodiment of a computer system which be used to implement any of the methods or flows disclosed herein.

FIG. 10 shows a flow chart of a method of determining metrology target measurement recipes and determining overlay using those metrology target measurement recipes. At 701, context data is obtained. The context data can include one or more design rules, such as a specification of a minimum pitch of periodic structure of a metrology target in relation to a wavelength of measurement radiation, a minimum manufacturable CD, etc. The context data can include stack information for the patterning process, which stack information describes details of the layer(s) on the substrate such as thickness of one or more layers, a refractive index of one or more layers, material type of one or more layers, a material uniformity of one or more layers, etc.

At 702, the context data is inputted to a simulator or other mathematical model (e.g. as described above) operated or computed by a computer processor. At 703, the simulator or model determines a plurality of metrology target measurement recipes (e.g., a plurality of different target designs) with corresponding overlay and structural asymmetry sensitivities K, S for the different structural asymmetries a represented by the metrology target measurement recipes. The formulas described above, or variants thereof, can be used to arrive at the metrology target measurement recipes.

At this point, the process may proceed to 710 where overlay may be calculated using measurement results obtained using the metrology target measurement recipes determined at 703. For example, overlay can be calculated using the formulas described above, or variants thereof, and the values of corresponding overlay and structural asymmetry sensitivities K, S determined from 703.

Optionally, further analysis (704-708) can be used to fine tune the metrology target measurement recipes. In particular, this further analysis focuses on fine tuning the measurement settings (e.g., polarization, wavelength) for the one or more target designs of the metrology target measurement recipes.

At 704, the metrology targets of the metrology target measurement recipes are exposed on one or more substrates. At 705, the one or more substrates are measured with an inspection apparatus using a plurality of measurement settings (e.g., a plurality of wavelengths and/or polarizations) to yield, diffraction responses $A_i$ ($\lambda$, p) where $\lambda$ is the measurement beam wavelength and p is the measurement beam polarization.

At 706, a data driven optimization is carried out based upon diffraction responses $A_i$ ($\lambda$, p). In an embodiment, the data driven optimization determines the overlay for each set of measurement settings and the one or more weighting factors $w_i$ (see, e.g., Eqs. 6 and 18) are optimized by identifying the one or more weighting factors $w_i$ that, e.g., minimize the measurement setting-to-measurement setting overlay variance (e.g., minimize the wavelength-to-wavelength overlay variance and/or minimize the polarization-to-polarization overlay variance). One or more initial weighting factors used in the data driven optimization may be those obtained by the simulation or model at 703, although this is not a requirement.

Additionally or alternatively to 706, one or more optimized weighting factors W, may be determined at 707 by matching an overlay determined from the diffraction responses $A_i$ ($\lambda$, p) to a reference overlay data set (e.g., an overlay data set measured using a different measuring technique such as a scanning electron microscope (SEM) or other measurement tool). For example, a least squares fit can be performed for each of the different structural asymmetries a to arrive at the one or more weighting factors $w_i$.

With the fine-tuned weighting factors at 708, the overlay can then be calculated at 709.

Desirably, in an embodiment, the metrology target measurement recipes differ in terms of target designs. This is because multiple different target designs can be measured at a same time or during a single measurement sequence, without significant throughput penalty (compared to a possible throughput penalty arising from a target measured using multiple different wavelengths and/or polarizations). Advantageously, the multiple target design can be sized so that they are simultaneously covered by at least part of a measurement beam spot. For example, the multiple targets can together be smaller than the spot size of the measurement beam. So, in an embodiment, the different metrology targets are optimized for asymmetry robustness and placed next to each other with the purpose of measuring them in one acquisition. Then, the multi-design metrology targets can be used to measure overlay with a same set of measurement settings with little or no throughput penalty. As an example, four metrology targets, each with a different design, having a spatial extent so that each of the metrology targets is at least partly covered simultaneously by a beam spot can be used to address three orthogonal structural asymmetry sources. In an embodiment, each of those metrology targets can be designed to measure overlay in orthogonal directions. If overlay in only one direction is considered (e.g., possible in measuring overlay for memory devices), then eight metrology targets, each with a different design, may be used and this accounts for up to seven orthogonal structural asymmetries.

In an embodiment, the determined weighted overlay can be compared with a calculated overlay without weighting so as to make an estimate of processing effect. Such values of unweighted overlay target-to-target variation can be reported as a metric for process monitoring.

Thus, in an embodiment, there is provided a method that designs/predicts metrology target measurement recipes (e.g., different metrology target designs) that have optimized distinct sensitivities to structural asymmetry with the purpose to turn measurements using those metrology target measurement recipes into a joint/weighted measurement parameter result substantially insensitive to structural asymmetry and desirably maximally sensitive to the measurement parameter (e.g., overlay). In an embodiment, the designing/predicting aims at resolving multiple types of structural asymmetries by use of a plurality of different metrology target measurement recipes (compared to a typical use of a single metrology target measurement recipe for a substrate) that are specifically designed for one or more particular structural asymmetries. In an embodiment, the metrology target measurement recipes differ in terms of their metrology target designs. Measurement using the differently metrology target measurement recipes can then be combined using an appropriate weighting to yield a performance parameter result that is substantially insensitive to the one or more particular structural asymmetries.

So, in an embodiment, the above techniques can facilitate greater accuracy (although it may require more metrology target "real estate" and/or require measuring with multiple measurement settings). In an embodiment, the above techniques can yield performance parameter results more robust against processing variation in the patterning process. In an embodiment, no new inspection apparatus design may be required because it can use an existing inspection apparatus that can execute measurements using multiple metrology target measurement recipes (e.g., measure a target with multiple measurement settings and/or measure a plurality of different metrology designs in a single acquisition). In an embodiment, the above techniques can have little or no throughput penalty (e.g., likely no throughput penalty when using targets with different designs and a same set of measurement settings or little throughput penalty when using a same target by, e.g., quickly switching between polarizations and/or wavelengths or measuring multiple polarizations and/or wavelengths at a same time. In an embodiment, the results of the multiple metrology target measurement recipes can be used for patterning process design, monitoring, control, etc.

In an embodiment, there is provided a method of measuring a parameter of a patterning process, the method comprising: obtaining a measurement of a substrate processed by a patterning process, with a first metrology target measurement recipe; obtaining a measurement of the substrate with a second, different metrology target measurement recipe, wherein measurements using the first and second metrology target measurement recipes have their own distinct sensitivity to a metrology target structural asymmetry of the patterning process; and determining, by a hardware computer, a value of the parameter by a weighted combination of the measurements of the substrate using the first and second metrology target measurement recipes, wherein the weighting reduces or eliminates the effect of the metrology target structural geometric asymmetry on the parameter of the patterning process determined from the measurements using the first and second metrology target measurement recipes.

In an embodiment, the parameter is overlay. In an embodiment, the weighting is a function of the sensitivities of the first and second metrology target measurement recipes to the metrology target structural asymmetry. In an embodiment, the weighting comprises a ratio of the sensitivities of the measurements using the first and second metrology target measurement recipes to the metrology target structural asymmetry. In an embodiment, the first and second metrology target measurement recipes differ in terms of a geometrical parameter of the metrology target design. In an embodiment, the metrology targets of different design of the first and second metrology target measurement recipes are arranged near to each other such that a measurement beam spot can cover at least part of each of the metrology targets simultaneously. In an embodiment, the first and second metrology target measurement recipes differ in terms of a measurement beam setting. In an embodiment, the method further comprises designing the first and second metrology target measurement recipes. In an embodiment, the metrology target structural asymmetry comprises an asymmetric geometric deviation of the target from the target's nominal or unperturbed geometry. In an embodiment, the metrology target structural asymmetry comprises a side-wall angle asymmetry and/or a bottom wall tilt. In an embodiment, the metrology target structural asymmetry arises from a physical processing operation of the patterning process. In an embodiment, the determining involves a weighted combination of more than two metrology target measurement recipes.

In an embodiment, there is provided a method comprising: designing, by a hardware computer, a first metrology target measurement recipe for measuring a substrate processed by a patterning process and for determining a parameter of the patterning process; designing, by the hardware computer, a second metrology target measurement recipe for measuring the substrate processed by the patterning process and for determining the parameter of the patterning process, wherein the first and second metrology target measurement recipes are designed with their own distinct sensitivity to a metrology target structural asymmetry; and determining, by the hardware computer, a weighting for the combination of measurement results using the first and second metrology target measurement recipes, to reduce or eliminate the effect of the metrology target structural asymmetry on the parameter of the patterning process determined from the measurement results using the first and second metrology target measurement recipes.

In an embodiment, the parameter is overlay. In an embodiment, the weighting is a function of the sensitivities of the first and second metrology target measurement recipes to the metrology target structural asymmetry. In an embodiment, the weighting comprises a ratio of the sensitivities of the measurements using the first and second metrology target measurement recipes to the metrology target structural asymmetry. In an embodiment, the first and second metrology target measurement recipes differ in terms of a geometrical parameter of the metrology target design. In an embodiment, the metrology targets of different design of the first and second metrology target measurement recipes are designed to be near to each other such that a measurement beam spot can cover at least part of each of the metrology targets simultaneously. In an embodiment, the first and second metrology target measurement recipes differ in terms of a measurement beam setting. In an embodiment, the designing comprises performing a simulation of metrology target measurements to evaluate a plurality of different metrology target measurement recipe parameters to identify the first and second metrology target measurement recipes. In an embodiment, the determining the weighting comprises obtaining measurement results using the first and second metrology target measurement recipes at a plurality of values of a measurement setting and calculating a weighting that minimizes the measurement setting-to-measurement setting variance of the parameter. In an embodiment, the determining the weighting comprises obtaining measurement results using the first and second metrology target measurement recipes and calculating a weighting factor based on comparison of the parameter determined from the measurement results and the parameter as determined by another measurement technique. In an embodiment, the metrology target structural asymmetry comprises an asymmetric geometric deviation of the target from the target's nominal or unperturbed geometry. In an embodiment, the metrology target structural asymmetry comprises a side-wall angle asymmetry and/or a bottom wall tilt. In an embodiment, the metrology target structural asymmetry arises from a physical processing operation of the patterning process. In an embodiment, the determining involves determining a weighting of more than two metrology target measurement recipes.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

FIG. 8 shows a block diagram that illustrates an embodiment of a computer system 800 which can assist in implementing any of the methods and flows disclosed herein. Computer system 800 includes a bus 802 or other communication mechanism for communicating information, and a processor 804 (or multiple processors 804 and 805) coupled with bus 802 for processing information. Computer system 800 also includes a main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Computer system 800 further includes a read only memory (ROM) 808 or other static storage device coupled to bus 802 for storing static information and instructions for processor 804. A storage device 810, such as a magnetic disk or optical disk, is provided and coupled to bus 802 for storing information and instructions.

Computer system 800 may be coupled via bus 802 to a display 812, such as a cathode ray tube (CRT) or flat panel or touch panel display for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 800 in response to processor 804 executing one or more sequences of one or more instructions contained in main memory 806. Such instructions may be read into main memory 806 from another computer-readable medium, such as storage device 810. Execution of the sequences of instructions contained in main memory 806 causes processor 804 to perform the process steps described herein. One or more processors in a multi-processing arrangement may also be employed to execute the sequences of instructions contained in main memory 806. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 804 for execution. Such a medium may take many forms, including but not limited to, non-volatile media, volatile media, and transmission media. Non-volatile media include, for example, optical or magnetic disks, such as storage device 810. Volatile media include dynamic memory, such as main memory 806. Transmission media include coaxial cables, copper wire and fiber optics, including the wires that comprise bus 802. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 804 for execution. For example, the instructions may initially be borne on a magnetic disk of a remote computer. The remote computer can load the instructions into its dynamic memory and send the instructions over a telephone line using a modem. A modem local to computer system 800 can receive the data on the telephone line and use an infrared transmitter to convert the data to an infrared signal. An infrared detector coupled to bus 802 can receive the data carried in the infrared signal and place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 may also include a communication interface 818 coupled to bus 802. Communication interface 818 provides a two-way data communication coupling to a network link 820 that is connected to a local network 822. For example, communication interface 818 may be an integrated services digital network (ISDN) card or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the worldwide packet data communication network, now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are exemplary forms of carrier waves transporting the information.

Computer system 800 can send messages and receive data, including program code, through the network(s), network link 820, and communication interface 818. In the Internet example, a server 830 might transmit a requested code for an application program through Internet 828, ISP 826, local network 822 and communication interface 818. One such downloaded application may provide for a method or portion thereof as described herein, for example. The received code may be executed by processor 804 as it is received, and/or stored in storage device 810, or other non-volatile storage for later execution. In this manner, computer system 800 may obtain application code in the form of a carrier wave.

The embodiments may further be described using the following clauses

1. A method of measuring a parameter of a patterning process, the method comprising:

obtaining a measurement of a substrate processed by a patterning process, with a first metrology target measurement recipe;

obtaining a measurement of the substrate with a second, different metrology target measurement recipe, wherein measurements using the first and second metrology target measurement recipes have their own distinct sensitivity to a metrology target structural asymmetry of the patterning process; and determining, by a hardware computer, a value of the parameter by a weighted combination of the measurements of the substrate using the first and second metrology target measurement recipes, wherein the weighting reduces or eliminates the effect of the metrology target structural geometric asymmetry on the parameter of the patterning process determined from the measurements using the first and second metrology target measurement recipes.

2. The method of clause 1, wherein the parameter is overlay.

3. The method of clause 1 or clause 2, wherein the weighting is a function of the sensitivities of the first and second metrology target measurement recipes to the metrology target structural asymmetry.

4. The method of clause 3, wherein the weighting comprises a ratio of the sensitivities of the measurements using the first and second metrology target measurement recipes to the metrology target structural asymmetry.

5. The method of any of clauses 1 to 4, wherein the first and second metrology target measurement recipes differ in terms of a geometrical parameter of the metrology target design.

6. The method of clause 5, wherein the metrology targets of different design of the first and second metrology target measurement recipes are arranged near to each other such that a measurement beam spot can cover at least part of each of the metrology targets simultaneously.

7. The method of any of clauses 1 to 6, wherein the first and second metrology target measurement recipes differ in terms of a measurement beam setting.

8. The method of any of clauses 1 to 7, further comprising designing the first and second metrology target measurement recipes.

9. The method of any of clauses 1 to 8, wherein the metrology target structural asymmetry comprises an asymmetric geometric deviation of the target from the target's nominal or unperturbed geometry.

10. The method of clause 9, wherein the metrology target structural asymmetry comprises a side-wall angle asymmetry and/or a bottom wall tilt.

11. The method of any of clauses 1 to 10, wherein the metrology target structural asymmetry arises from a physical processing operation of the patterning process.

12. The method of any of clauses 1 to 11, wherein the determining involves a weighted combination of more than two metrology target measurement recipes.

13. A method comprising:

designing, by a hardware computer, a first metrology target measurement recipe for measuring a substrate processed by a patterning process and for determining a parameter of the patterning process;

designing, by the hardware computer, a second metrology target measurement recipe for measuring the substrate processed by the patterning process and for determining the parameter of the patterning process, wherein the first and second metrology target measurement recipes are designed with their own distinct sensitivity to a metrology target structural asymmetry; and determining, by the hardware computer, a weighting for the combination of measurement results using the first and second metrology target measurement recipes, to reduce or eliminate the effect of the metrology target structural asymmetry on the parameter of the patterning process determined from the measurement results using the first and second metrology target measurement recipes.

14. The method of clause 13, wherein the parameter is overlay.

15. The method of clause 13 or clause 14, wherein the weighting is a function of the sensitivities of the first and second metrology target measurement recipes to the metrology target structural asymmetry.

16. The method of clause 15, wherein the weighting comprises a ratio of the sensitivities of the measurements using the first and second metrology target measurement recipes to the metrology target structural asymmetry.

17. The method of any of clauses 13 to 16, wherein the first and second metrology target measurement recipes differ in terms of a geometrical parameter of the metrology target design.

18. The method of clause 17, wherein the metrology targets of different design of the first and second metrology target measurement recipes are designed to be near to each other such that a measurement beam spot can cover at least part of each of the metrology targets simultaneously.

19. The method of any of clauses 13 to 18, wherein the first and second metrology target measurement recipes differ in terms of a measurement beam setting.

20. The method of any of clauses 13 to 19, wherein the designing comprises performing a simulation of metrology target measurements to evaluate a plurality of different metrology target measurement recipe parameters to identify the first and second metrology target measurement recipes.

21. The method of any of clauses 13 to 20, wherein the determining the weighting comprises obtaining measurement results using the first and second metrology target measurement recipes at a plurality of values of a measurement setting and calculating a weighting that minimizes the measurement setting-to-measurement setting variance of the parameter.

22. The method of any of clauses 13 to 21, wherein the determining the weighting comprises obtaining measurement results using the first and second metrology target measurement recipes and calculating a weighting factor based on comparison of the parameter determined from the measurement results and the parameter as determined by another measurement technique.

23. The method of any of clauses 13 to 22, wherein the metrology target structural asymmetry comprises an asymmetric geometric deviation of the target from the target's nominal or unperturbed geometry.

24. The method of clause 23, wherein the metrology target structural asymmetry comprises a side-wall angle asymmetry and/or a bottom wall tilt.

25. The method of any of clauses 13 to 24, wherein the metrology target structural asymmetry arises from a physical processing operation of the patterning process.

26. The method of any of clauses 13 to 25, wherein the determining involves determining a weighting of more than two metrology target measurement recipes.

27. A computer program product comprising a computer non-transitory readable medium having instructions recorded thereon, the instructions when executed by a computer implementing the method of any of clauses 1 to 26.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method of measuring a parameter of a patterning process, the method comprising:
    obtaining a measurement of a substrate processed by a patterning process, with a first metrology target measurement recipe;
    obtaining a measurement of the substrate with a second, different metrology target measurement recipe, wherein measurements using the first and second metrology target measurement recipes have their own distinct sensitivity to a metrology target structural asymmetry of the patterning process; and
    determining, by a hardware computer, a value of the parameter by a weighted combination of the measurements of the substrate using the first and second metrology target measurement recipes, wherein the weighting reduces or eliminates the effect of the metrology target structural asymmetry on the parameter of the patterning process determined from the measurements using the first and second metrology target measurement recipes.

2. The method of claim 1, wherein the parameter is overlay.

3. The method of claim 1, wherein the weighting is a function of the sensitivities of the first and second metrology target measurement recipes to the metrology target structural asymmetry.

4. The method of claim 3, wherein the weighting comprises a ratio of the sensitivities of the measurements using the first and second metrology target measurement recipes to the metrology target structural asymmetry.

5. The method of claim 1, wherein the first and second metrology target measurement recipes differ in terms of a geometrical parameter of metrology target design.

6. The method of claim 5, wherein metrology targets of different design of the first and second metrology target measurement recipes are arranged near to each other such that a measurement beam spot can cover at least part of each of the metrology targets simultaneously.

7. The method of claim 1, wherein the first and second metrology target measurement recipes differ in terms of a measurement beam setting.

8. The method of claim 1, wherein the metrology target structural asymmetry comprises an asymmetric geometric deviation of the target from the target's nominal or unperturbed geometry.

9. The method of claim 8, wherein the metrology target structural asymmetry comprises a side-wall angle asymmetry and/or a bottom wall tilt.

10. The method of claim 1, wherein the metrology target structural asymmetry arises from a physical processing operation of the patterning process.

11. The method of claim 1, wherein the determining involves a weighted combination of more than two metrology target measurement recipes.

12. A method comprising:
    designing, by a hardware computer, a first metrology target measurement recipe for measuring a substrate processed by a patterning process and for determining a parameter of the patterning process;
    designing, by the hardware computer, a second metrology target measurement recipe for measuring the substrate processed by the patterning process and for determining the parameter of the patterning process, wherein the first and second metrology target measurement recipes are designed with their own distinct sensitivity to a metrology target structural asymmetry; and
    determining, by the hardware computer, a weighting for the combination of measurement results using the first and second metrology target measurement recipes, to reduce or eliminate the effect of the metrology target structural asymmetry on the parameter of the patterning process determined from the measurement results using the first and second metrology target measurement recipes.

13. The method of claim 12, wherein the parameter is overlay.

14. The method of claim 12, wherein the weighting is a function of the sensitivities of the first and second metrology target measurement recipes to the metrology target structural asymmetry.

15. A computer program product comprising a non-transitory computer-readable medium having instructions therein, the instructions, upon execution by a computer system, configured to cause the computer system to at least:
    obtain a measurement of a substrate processed by a patterning process, with a first metrology target measurement recipe;
    obtain a measurement of the substrate with a second, different metrology target measurement recipe, wherein measurements using the first and second metrology target measurement recipes have their own distinct sensitivity to a metrology target structural asymmetry of the patterning process; and
    determine a value of the parameter by a weighted combination of the measurements of the substrate using the first and second metrology target measurement recipes, wherein the weighting reduces or eliminates the effect of the metrology target structural asymmetry on the parameter of the patterning process determined from the measurements using the first and second metrology target measurement recipes.

16. The computer program product of claim 15, wherein the weighting is a function of the sensitivities of the first and second metrology target measurement recipes to the metrology target structural asymmetry.

17. The computer program product of claim 16, wherein the weighting comprises a ratio of the sensitivities of the measurements using the first and second metrology target measurement recipes to the metrology target structural asymmetry.

18. The computer program product of claim 15, wherein the first and second metrology target measurement recipes differ in terms of a geometrical parameter of metrology target design.

19. The computer program product of claim 15, wherein the first and second metrology target measurement recipes differ in terms of a measurement beam setting.

20. A computer program product comprising a non-transitory computer-readable medium having instructions therein, the instructions, upon execution by a computer system, configured to cause the computer system to at least:
design a first metrology target measurement recipe for measuring a substrate processed by a patterning process and for determining a parameter of the patterning process;
design a second metrology target measurement recipe for measuring the substrate processed by the patterning process and for determining the parameter of the patterning process, wherein the first and second metrology target measurement recipes are designed with their own distinct sensitivity to a metrology target structural asymmetry; and
determine a weighting for the combination of measurement results using the first and second metrology target measurement recipes, to reduce or eliminate the effect of the metrology target structural asymmetry on the parameter of the patterning process determined from the measurement results using the first and second metrology target measurement recipes.

* * * * *